(12) United States Patent
Frazier

(10) Patent No.: US 7,411,172 B1
(45) Date of Patent: *Aug. 12, 2008

(54) METHOD AND APPARATUS FOR RESETTING A HIGH SPEED LATCH CIRCUIT

(75) Inventor: Gary A. Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/468,152

(22) Filed: Aug. 29, 2006

Related U.S. Application Data

(63) Continuation of application No. 10/717,864, filed on Nov. 19, 2003, now Pat. No. 7,098,438.

(51) Int. Cl.
*H03F 3/08* (2006.01)
*H03K 17/78* (2006.01)
*G01J 5/00* (2006.01)

(52) U.S. Cl. .................... 250/214 R; 250/214 LS; 331/66

(58) Field of Classification Search ............. 250/214 R, 250/214 LS; 331/66; 327/169, 195
See application file for complete search history.

(56) References Cited

U.S. PATENT DOCUMENTS 6,288,617 B1 * 9/2001 Broekaert .................... 331/66

FOREIGN PATENT DOCUMENTS

JP 11068521 A * 3/1999

* cited by examiner

*Primary Examiner*—Thanh X. Luu
*Assistant Examiner*—Brian J Livedalen
(74) *Attorney, Agent, or Firm*—Baker Botts L.L.P.

(57) ABSTRACT

A latch circuit includes first and second resonant tunneling diodes coupled in series, and a reset portion having a photodiode portion responsive to varying photonic energy for switching between first and second states which are different. When the photodiode portion is in its first state, the reset portion normalizes a voltage across each of the resonant tunneling diodes.

9 Claims, 3 Drawing Sheets

METHOD AND APPARATUS FOR RESETTING A HIGH SPEED LATCH CIRCUIT

RELATED APPLICATIONS

This application is a continuation of Ser. No. 10/717,864, now U.S. Pat. No. 7,098,438 entitled METHOD AND APPARATUS FOR RESETTING A HIGH SPEED LATCH CIRCUIT filed Nov. 19, 2003.

GOVERNMENT INTEREST

This invention was made with Government support under Contract No. N00014-98-3-0013. The Government has certain rights in this invention.

TECHNICAL FIELD OF THE INVENTION

This invention relates in general to high-speed latch circuits and, more particularly, to techniques for resetting a high-speed latch circuit.

BACKGROUND OF THE INVENTION

High-speed latches can be used to build sophisticated digital processing systems, such as those used to process microwave signals. These latches store digital data under the action of a clock signal. Where the clock signal has a high frequency, for example above 1 GHz and up to 500 GHz or more, one known type of latch has two resonant tunneling diodes (RTDs), which are coupled in series and which operate at GHz clock rates with very low power consumption.

In these known latch circuits, the series-coupled RTDs receive electrical power from a current-limited voltage source, which may for example be a battery and two resistors. The data input signal may be supplied to the latch through a resistor coupled to the node between the RTDs. A reset circuit is normally coupled across the series-connected RTDs. For example, where the two RTDs are coupled in series between first and second nodes, one known reset circuit has a simple field effect transistor (FET) with its source and drain respectively coupled to the first and second nodes, and has a clock signal which is applied to the gate of the FET. The voltage of the clock signal varies in a periodic manner over time, so that the electrical resistance of the drain-to-source path through the FET alternates between a highly resistive state and a highly conducting state. When the FET is in its highly conducting state, the potential difference between the drain and source terminals of the FET, which is also the potential difference between the outer nodes of the series-coupled RTDs, drops to a value sufficient to force the voltage across both RTDs to a low or "off" state. When the latch is in this state, it is said to be reset.

When the clock signal changes state and causes the FET to change to its highly resistive state, the voltage across the series-coupled RTDs rises until one or both of the RTDs switches to a high voltage or "on" state. The final electrical state of the RTDs is determined by the polarity of the electrical current which is being provided to the latch by the data input signal at the moment in time when the FET transitions from its highly conducting state to its highly resistive state. Thus, this circuit configuration provides an edge sensitive clocked digital latch.

Although this configuration has been generally adequate for its intended purpose, it has not been satisfactory in all respects. For example, one disadvantage is that the dynamic gate current of the FET is effectively introduced into the operation of the latch circuit, which is a phenomenon commonly known as "clock injection". In more detail, as the voltage of the clock signal varies over time, a displacement current is produced at the gate of the FET, and is proportional to the rate of change of the clock signal voltage. This current passes through the drain and source nodes of the FET and into the RTD circuitry, and can upset the normal electrical balance of the latch, which in turn prevents the latch from accurately capturing the value of the data input signal. This disadvantageous effect of clock injection increases with the frequency of the clock, so that the known latch circuit is limited in its frequency of operation by the effect of clock injection.

SUMMARY OF THE INVENTION

From the foregoing, it may be appreciated that a need has arisen for a method and apparatus for resetting a high-speed latch circuit, in a manner which avoids at least the known problem of clock injection. According to the present invention, a method and apparatus are provided to address this need, in a context where a latch circuit has first and second resonant tunneling diodes coupled in series with each other between first and second nodes, and a reset portion coupled to the first and second nodes. The method and apparatus involve: configuring the reset portion to include a photodiode portion which is responsive to varying photonic energy for switching between first and second states that are different; and causing the photodiode portion to normalize a voltage across each of the resonant tunneling diodes when the reset portion is in its first state.

BRIEF DESCRIPTION OF THE DRAWINGS

A better understanding of the present invention will be realized from the detailed description which follows, taken in conjunction with the accompanying drawings, in which.

DETAILED DESCRIPTION

Figure 1:
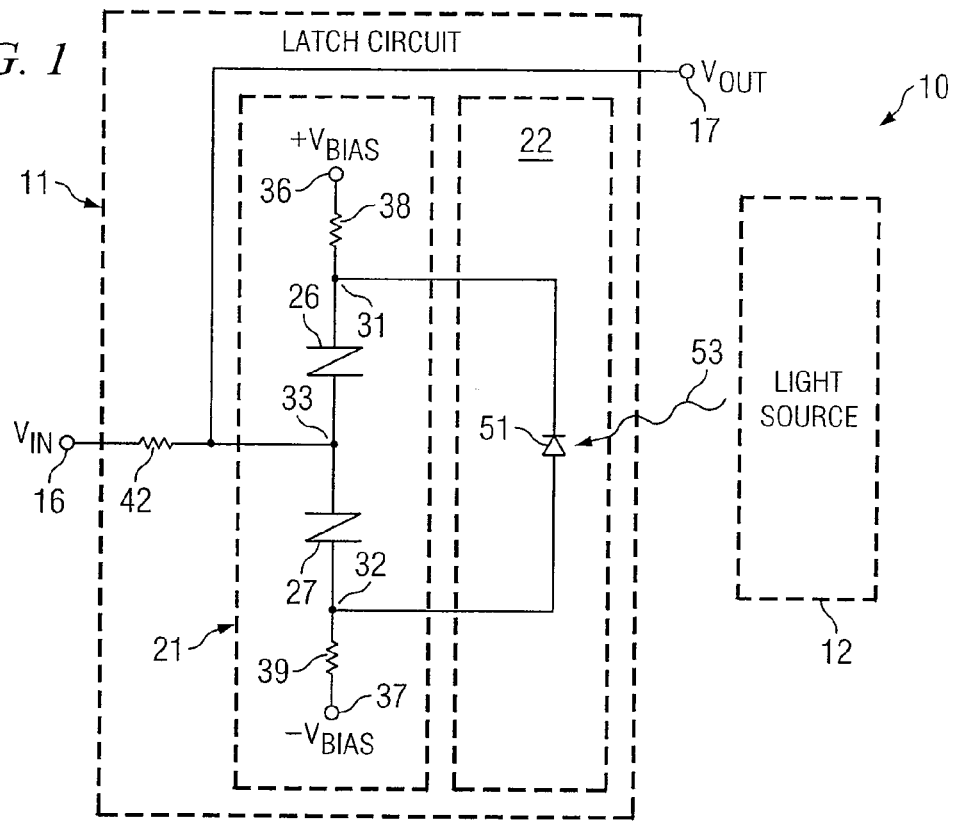
FIG. 1 is a schematic diagram of an apparatus which embodies aspects of the present invention.

FIG. 1 is a schematic diagram of an apparatus 10 which includes a latch circuit 11 and a light source 12. The latch circuit 11 has an input terminal 16, to which an input voltage $V_{IN}$ is applied, and has an output terminal 17, at which the latch circuit 11 produces an output voltage $V_{OUT}$.

The latch circuit 11 includes a latch portion 21, and a recess portion 22. The latch portion 21 includes two resonant tunneling diodes (RTDS) 26 and 27 of a known type, which are coupled in series between two nodes 31 and 32, with a further node 33 defined between the RTDs 26 and 27. The latch portion 21 has a bias terminal 36, to which is applied a positive direct current (DC) bias voltage $+V_{BIAS}$. The latch portion 21 has a further bias terminal 37, to which is applied a negative DC bias voltage $-V_{BIAS}$. The bias voltages applied to the bias terminals 36 and 37 are opposite in polarity, but equal in magnitude.

The latch portion 21 includes a resistor 38 which is coupled between the bias terminal 36 and the node 31, and a further resistor 39 which is coupled between the bias terminal 37 and the node 32. The resistors have equivalent resistance characteristics.

The latch circuit 11 includes an input resistor 42, which is coupled between the input terminal 16 and the node 33. The node 33 is coupled to the output terminal 17. The reset portion 22 includes a photodiode 51 of a known type, such as a PIN photodiode or a metal-semiconductor-metal (MSM) photodiode. The photodiode 51 has its cathode coupled to the node 31, and its anode coupled to the node 32.

In the disclosed embodiment, the light source 12 is a periodic pulsed laser of a type known in the art, such as a mode-locked laser, or a fiber-ring laser. Alternatively, the light source 12 could be a continuous laser with a mechanical shutter, or some other device that produces a periodic optical signal. The light source 12 outputs a varying optical signal 53, which serves as a clock signal that varies in a periodic manner.

The RTDs 26 and 27 are selected or configured to be substantially identical to each other, so that they have substantially equivalent operational characteristics.

The operational characteristics of RTDs are known in the art but, to facilitate an understanding of the present invention, are discussed briefly here. In this regard, since the RTDs 26 and 27 are effectively identical, the following discussion focuses only on the RTD 27.

Figure 2:
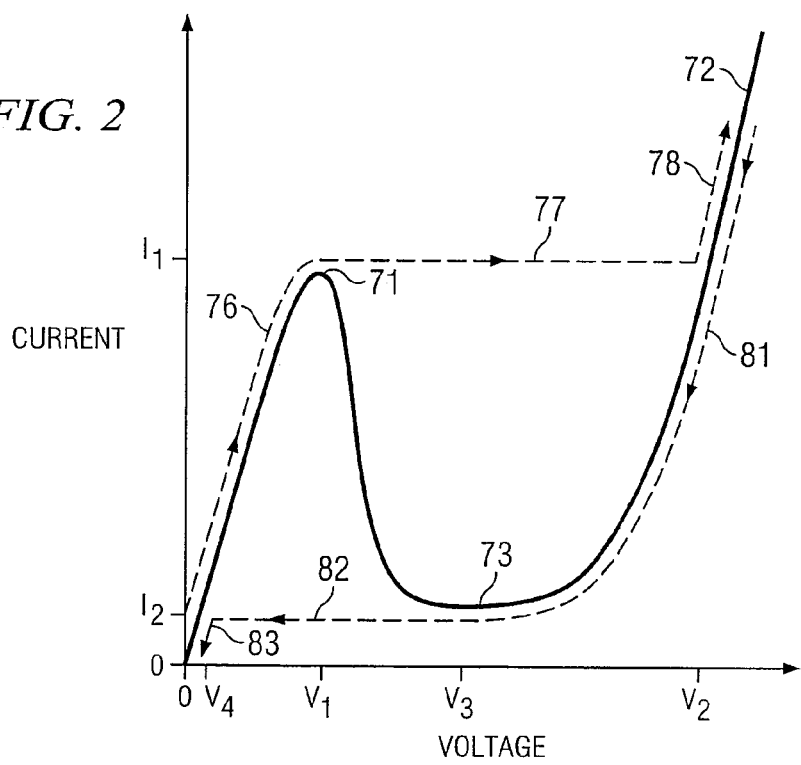
FIG. 2 is a graph showing a curve that represents how a current flowing through a resonant tunneling diode (RTD) will vary in response to variation of a voltage applied across that RTD.

FIG. 2 is a graph with a curve that shows how an electrical current through the RTD 27 will vary in response to variation of a voltage applied across the RTD 27. It will be noted that the RTD current versus voltage response has a resonant peak in current at 71, and normally has a further and larger resonant peak in current at 72 which is not visible in its entirety in FIG. 2. The current has a valley at 73, between the two peaks 71 and 72.

Although the curve in FIG. 2 can be viewed as a representation of how current varies as a function of a variation in voltage, it can conversely be viewed as a representation of how voltage varies as a function of a variation in current. In this regard, it will be noted that, as the current is progressively increased to a value of $I_1$ from a value of zero, the voltage progressively increases to a value of $V_1$ from a value of zero, as indicated diagrammatically at 76.

Then, as soon as the current exceeds the value $I_1$ the voltage suddenly makes a significant jump at 77 from a value of $V_1$ at the top of the resonant peak 71 to a value of $V_2$ at a point along the leading edge of the resonant peak 72. As is known in the art, this significant change in voltage from $V_1$ to $V_2$ occurs extremely rapidly, for example as fast as about 1.5 to 2.0 picoseconds. Thereafter, as the current continues to progressively increase above the value $I_1$, the voltage progressively increases above the value $V_2$, as indicated diagrammatically at 78.

Assume that the current is thereafter progressively decreased. The voltage progressively decreases, as indicated diagrammatically at 81. The decreasing current eventually reaches a value of $I_2$, which corresponds to a voltage of $V_3$. As soon as the current is decreased below the value $I_2$, then the voltage jumps very rapidly at 82 from the voltage $V_3$ to the voltage $V_4$, and then continues to progressively decrease as shown at 83. The change at 82 from the voltage $V_3$ to the voltage $V_4$ occurs very rapidly, for example within about 2.0 picoseconds or less.

As is known in the art, the curve shown in FIG. 2 represents the relationship between a positive current and a positive voltage for the RTD 27. For a negative current and voltage, there is a similar curve for the RTD 27, which is a mirror image of the curve shown in FIG. 2, reflected about the origin point at the intersection of the two axes.

Figure 3:
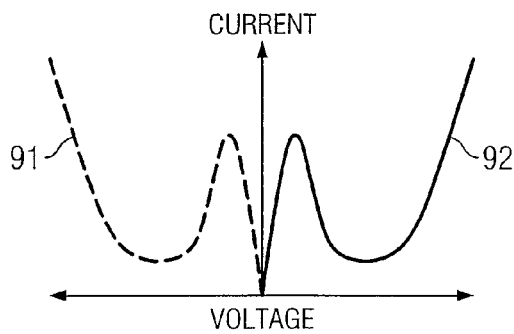
FIG. 3 is a graph showing two curves which are each equivalent to the curve shown in FIG. 2, but which each correspond to a respective different RTD in the embodiment of FIG. 1.

FIG. 3 is a graph showing two curves 91 and 92 which are each equivalent to the curve shown in FIG. 2, but which each correspond to a respective one of the RTDs 26 and 27. In particular, the curve 91 is for the RTD 26, and the curve 92 is for the RTD 27. FIG. 3 shows the relative relationship that these two curves would effectively have if there were no bias voltages applied to the RTDs 26 and 27.

Figure 4:
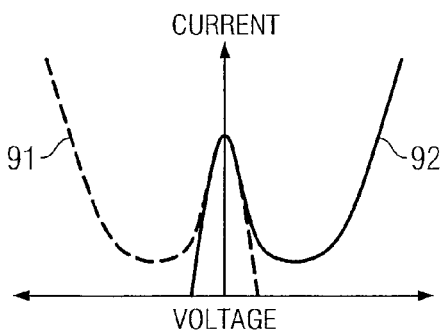
FIGS. 4 and 5 are each a graph which is similar to the graph of FIG. 3, but which show the relative relationship imparted to the two curves of FIG. 3 under various different operational conditions.

FIG. 4 is a graph which is similar to FIG. 3, except that it shows the relative relationship imparted to the curves 91 and 92 as a result of the bias voltages applied from the terminals 36 and 37 through the resistors 38 and 39, when the input terminal 16 is maintained at a voltage of zero. In other words, the values of the resistors 38 and 39, and values of the bias voltages applied to the terminals 36 and 37, are selected so that the smaller resonant peaks of the two curves 91 and 92 will be aligned with each other when the input terminal 16 is being maintained at zero volts.

The latch circuit 11 of FIG. 1 operates in the following manner. As the optical signal 53 is varied between two different intensities in a periodic manner, the photodiode 51 responds to the optical signal 53 by changing between two different operational states. In one operational state, the photodiode 51 is conductive. In the other operational state, the photodiode 51 is substantially non-conductive.

When the photodiode 51 is conductive, it essentially appears as a short between the nodes 31 and 32, thereby initializing the voltage across each of the RTDs 26 and 27 to a value of effectively zero volts. Then, when the optical signal 53 changes and causes the photodiode 51 to switch from its conductive state to its non-conductive state, the latch portion 21 will latch itself into one of two different equilibrium states, depending on the value of the input voltage $V_{IN}$ present at the input terminal 16 when the photodiode 51 switches to its non-conductive state. The manner in which this occurs in explained in more detail below.

First, assume that the photodiode 51 is in its conductive state, and that the input voltage $V_{IN}$ at the terminal 16 is a positive voltage representing a binary "1". Since the nodes 31 and 32 are effectively shorted together by the conductive photodiode 51, they will both be at substantially the same voltage. To the extent that a nominal current may possibly flow through the resistor 42 from the input terminal 16, it will split into two equal components that respectively flow through the RTDs 26 and 27, producing the same small voltage across each RTD from the node 33 to the respective node 31 or 32. The voltage across each of the RTDs 26 and 27 will be effectively zero.

When the photodiode 51 changes from its conductive state to its non-conductive state, a current component will flow from the terminal 36 through the resistor 38, the RTDs 26 and 27, and the resistor 39 to the terminal 37. This magnitude of this current component will be the same in each of the RTDs 26 and 27. As this current progressively increases, it will tend to cause the voltages across the RTDs 26 and 27 to progressively increase. If this was the only current flowing, the voltages across the RTDs 26 and 27 would always be substantially identical at any given point in time. However, a further current component is caused by the input voltage $V_{IN}$ at the input terminal 16, and must also be taken into account.

More specifically, since it is being assumed that the input voltage at the terminal 16 is a positive voltage, a current component will be caused to flow from the terminal 16 through the resistor 42, the RTD 27 and the resistor 39 to the bias terminal 37. Thus, in addition to the current component which is flowing through both of the RTDs 26 and 27, there is an additional current component which flows through the RTD 27 but not the RTD 26. Therefore, the total current flowing through the RTD 27 will be greater than the total current flowing through the RTD 26. As a result, and with reference to FIG. 2, the RTD 27 will reach the current $I_1$ corresponding to the top of its first resonant peak 71 somewhat before the RTD 26 can reach this same current and thus the top of its first resonant peak.

When the current flowing through the RTD 27 reaches and exceeds the current $I_1$ corresponding to the top of its first resonant peak, the voltage across the RTD 27 suddenly and rapidly jumps from $V_1$ to $V_2$ as indicated at 77. Consequently, the voltage across the RTD 27 will suddenly be significantly larger than the voltage across the RTD 26, which in turn will affect the ratio of voltages across the two RTDs 26 and 27. As a result, the characteristic curves 91 and 92 (FIG. 3) for the RTDs 26 and 27 will effectively shift with respect to each other, until a point of equilibrium is reached.

Figure 5:
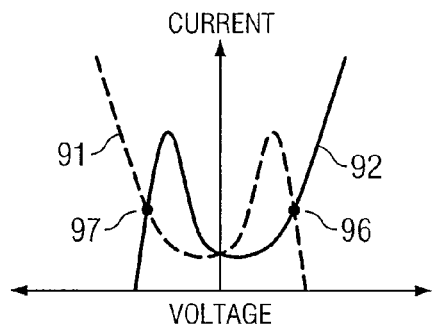

In this regard, FIG. 5 is a graph similar to FIGS. 3 and 4, but showing how the curves 91 and 92 will have shifted when an equilibrium is reached, where the equilibrium point along the two curves 91 and 92 is shown at 96, and corresponds to a binary "1". It will be noted that the equilibrium point 96 is disposed along the first resonant peak of the curve 91 for the RTD 26, and is disposed along the second resonant peak of the curve 92 for the RTD 27. The RTDs 26 and 27 become latched in this equilibrium state. The equilibrium point 96 represents the voltage at the node 33 between the two RTDs 26 and 27. As evident from FIG. 4, this is a positive voltage, because the voltage across the RTD 27 is larger than the voltage across the RTD 26. Since the node 33 is coupled directly to the output terminal 17, the output terminal 17 of the latch circuit 11 will be at a positive voltage, which represents a binary "1".

Turning now to the converse situation, assume that the input voltage $V_{IN}$ at the input terminal 16 is negative when the photodiode 51 changes from its conductive state to its non-conductive state. In this situation, a first current component will flow from the bias terminal 36 through the resistor 38, the RTDs 26 and 27, and the resistor 39 to the bias terminal 37. Since the input voltage $V_{IN}$ at the input terminal 16 is negative, a further current component will flow from the bias terminal 36 through the resistor 38, the RTD 26, and the resistor 42 to the input terminal 16. Consequently, the total current flowing through the RTD 26 will be greater than the total current flowing through the RTD 27. Therefore, with reference to FIG. 2, the voltage across the RTD 26 will reach the top of its first resonant peak 71 before the voltage across the RTD 27 can reach the top of its first resonant peak, thereby causing the RTD 26 to experience a rapid and significant increase in voltage, as indicated at 77 in FIG. 2.

The voltages and currents of the RTDs 26 and 27 will then adjust accordingly until they reach an equilibrium state, which is the point shown at 97 in FIG. 5. The RTDs 26 and 27 will be effectively latched in this state, where the node 33 and thus the output terminal 17 are each at a voltage less than zero, representing a binary "0".

After the RTDs 26 and 27 have become latched at either one of the two equilibrium points shown at 96 and 97 in FIG. 5, the latch circuit 11 will be reset when the optical signal 53 from the light source 12 changes in a manner that causes the photodiode 51 to switch from its non-conductive state to its conductive state. In particular, when the photodiode 51 becomes conductive, it appears as a short between the nodes 31 and 32, and effectively resets the latch portion 21 by returning the voltage across each of the RTDs 26 and 27 to an effective value of zero.

Figure 6:
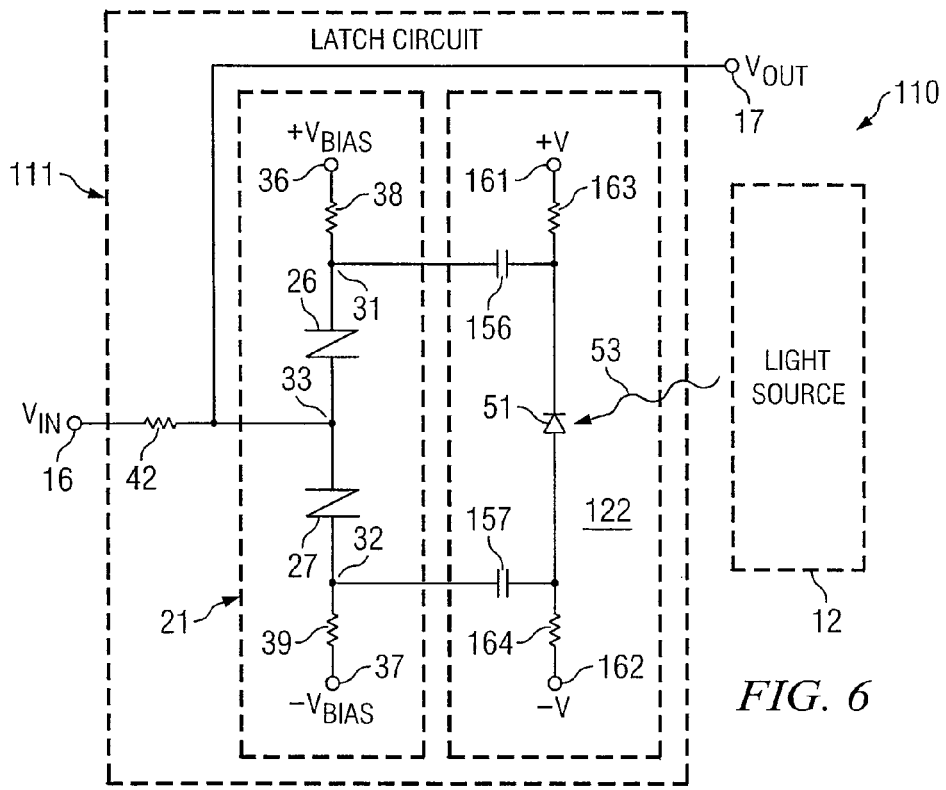
FIG. 6 is a schematic diagram of an apparatus which is an alternative embodiment of the apparatus of FIG. 1.

FIG. 6 is a schematic diagram of an apparatus 110 which is an alternative embodiment of the apparatus 10 of FIG. 1. The apparatus 110 is generally similar to the apparatus 10, except for some differences which are discussed below. Equivalent parts are identified with the same reference numerals, and the following discussion focuses primarily on the differences.

In FIG. 6, the apparatus 110 includes a latch circuit 111, which is identical to the latch circuit 11 shown in FIG. 1, except that it includes a reset portion 122 which is different from the reset portion 22 of FIG. 1. More specifically, the reset portion 122 in FIG. 6 has a capacitor 156 which is coupled between the node 31 and the cathode of the photodiode 51, and has a further capacitor 157 which is coupled between the node 32 and the anode of the photodiode 51. The capacitors 156 and 157 are effectively identical.

The latch portion 122 includes a terminal 161, to which is applied a positive DC voltage +V, and a further terminal 162, to which is applied a negative DC voltage −V. The voltage +V could optionally be the same as the voltage $+V_{BIAS}$, and the voltage −V could optionally be the same as the voltage $-V_{BIAS}$. A resistor 163 is coupled between the terminal 161 and the cathode of the photodiode 51, and a further resistor 164 is coupled between the terminal 162 and the anode of the photodiode 51. The resistors 163 and 164 are effectively identical.

The operation of the latch circuit 111 of FIG. 6 is generally similar to the operation of the latch circuit 11 of FIG. 1, and is therefore not described here in detail. It is sufficient to point out that, when the photodiode 51 changes state in response to the optical signal 53, pulses are produced through the capacitors 156 and 157 and serve to normalize or reset the RTDs 26 and 27 so that the voltage across each is effectively zero.

Figure 7:
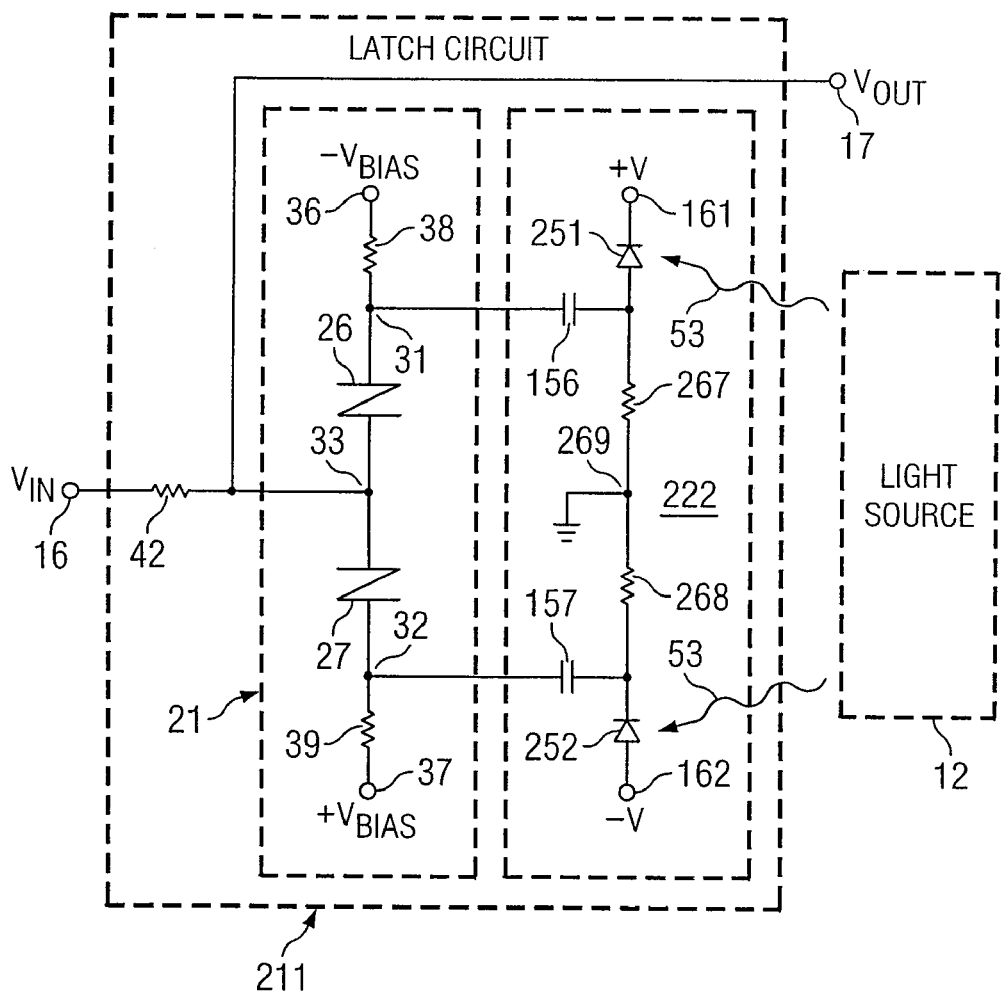
FIG. 7 is a schematic diagram of an apparatus which is a further alternative embodiment of the apparatus of FIG. 1.

FIG. 7 is a schematic diagram of an apparatus 210 which is a further alternative embodiment of the apparatus 10 of FIG. 1. The apparatus 210 of FIG. 7 is similar to the apparatus 10 of FIG. 1, except for differences which are discussed below. Equivalent parts are identified by the same reference numerals, and the following discussion focuses primarily on the differences. In FIG. 7, there are two arrows 53 which each represent an optical signal, but it should be understood that the light source 12 of FIG. 7 produces only a single optical signal, and this single optical signal is depicted at two different locations in FIG. 7 for clarity.

The apparatus 210 includes a latch circuit 211, which is effectively identical to the latch circuit 11 of FIG. 1, except that the bias voltages $+V_{BIAS}$ and $-V_{BIAS}$ in the latch portion 21 have been swapped, and the latch circuit 211 includes a reset portion 222 which is different from the reset portion 22 of FIG. 1. The reset portion 222 includes the capacitor 156, which has one end coupled to the node 31, and its other end coupled to the anode of a photodiode 251. The cathode of the photodiode 251 is coupled to the terminal 161. Similarly, the capacitor 157 has one end coupled to the node 32, and its other end coupled to the cathode of a further photodiode 252. The anode of the photodiode 252 is coupled to the terminal 162. The photodiodes 251 and 252 are known devices, and are equivalent.

A resistor 267 has one end coupled to the anode of the photodiode 251, and its other end coupled to a node 259 which in turn is coupled to ground. A resistor 268 has one end coupled to the cathode of the photodiode 252, and its other end coupled to the node 269. The resistors 267 and 268 are equivalent.

The latch circuit 211 of FIG. 7 operates in a manner which is generally similar to the latch circuit 11 of FIG. 1. The operation of the latch circuit 211 is therefore not described here in full detail. It is sufficient to mention that, in response to the optical signal 53 from the light source 12, the photodiodes 251 and 252 each change state in a manner producing pulses through the capacitors 156 and 157 which serve to reset the RTDs 26 and 27 so that voltage across each is effectively zero. More specifically, a positive-going voltage that appears across resistor 267 produces a positive displacement current in capacitor 156 which cancels the steady negative current in resistor 38. Similarly, a negative-going voltage that appears across resistor 268 produces a negative displacement current in capacitor 157 which cancels the steady positive current in resistor 39. The cancellation currents effectively reset each of the RTDs 26 and 27 to a low voltage state.

As evident from the foregoing discussion, the latch circuit 11 (FIG. 1), the latch circuit 111 (FIG. 6), and the latch circuit 211 (FIG. 7) have pairs of components that are effectively equivalent. For example, the resistors 26 and 27 are effectively equivalent, the resistors 38 and 39 are effectively equivalent, the capacitors 156 and 157 are effectively equivalent, the resistors 163 and 164 are effectively equivalent, the photodiodes 251 and 252 are effectively equivalent, the resistors 267 and 268 are effectively equivalent, and the RTDs 26 and 27 are effectively equivalent. Further, there are pairs of equal and opposite voltages, such as $+V_{BIAS}$ and $-V_{BIAS}$, and $+V$ and $-V$. However, it will be recognized that, through suitable design, the components of each pair and/or the voltages of each pair could be configured so that they are not equivalent. Also, it will be recognized that, although the drawings show certain selected circuit configurations, there are a variety of other possible circuit configurations which also embody the subject matter of the present invention.

The present invention provides a number of advantages. One such advantage is that, since the disclosed latch circuits each have a reset portion which is responsive to an optical control signal, the control signal does not inject any current into the latch circuit, thus preventing the latch circuit from being adversely influenced by an extraneous current derived from the control signal. This avoids the phenomenon commonly known as "clock injection".

A further advantage is that this is achieved in a latch circuit which is based on a pair of resonant tunneling diodes that inherently switch very fast, and that have a low power dissipation. The result is a latch which is extremely fast and can operate at clock speeds up to or greater than 500 GHz. Applications for such a latch include extremely fast analog-to-digital converters, digital-to-analog converters, true time delays, microwave memory, first-in-first-out memories, queuing systems, serial-to-parallel shift registers, and clocked logic, as well as a variety of other devices.

Although selected embodiments have been illustrated and described in detail, it will be understood that various substitutions and alterations are possible without departing from the spirit and scope of the present invention, as defined by the following claims.

What is claimed is:
1. An apparatus comprising a latch circuit which includes:
   first and second resonant tunneling devices coupled in series with each other between first and second nodes;
   a reset portion coupled to said first and second nodes, said reset portion including a photodiode portion responsive to varying photonic energy for switching between first and second states which are different, wherein when said photodiode portion is in said first state said reset portion normalizes a voltage across each of said resonant tunneling devices;
   a first terminal to which is applied a first voltage, and a second terminal to which is applied a second voltage less than said first voltage; and
   wherein said reset portion includes a first resistive element coupled between said first terminal and a first end of said photodiode portion, a first capacitive element coupled between said first node and said first end of said photodiode portion, a second resistive element coupled between said second terminal and a second end of said photodiode portion, and a second capacitive element coupled between said second node and said second end of said photodiode portion; a first bias terminal to which is applied a first bias voltage; a second bias terminal to which is applied a second bias voltage different from said first bias voltage; a third resistive element coupled between said first bias terminal and said first node; and a fourth resistive element coupled between said second bias terminal and said second node.

2. An apparatus according to claim 1, wherein said first and second resonant tunneling devices are resonant tunneling diodes which are substantially identical to each other.

3. An apparatus according to claim 2, including:
   a latch input terminal coupled to a third node disposed between said first and second resonant tunneling diodes; and
   a latch output terminal coupled to said third node.

4. An apparatus according to claim 3, including a resistive element, said input terminal being coupled to said third node through said resistive element.

5. An apparatus according to claim 1,
   wherein said third and fourth resistive elements have substantially the same resistive characteristic; and
   wherein one of said first and second bias voltages is a positive voltage, and the other thereof is a negative voltage substantially equal and opposite in magnitude to said positive voltage.

6. An apparatus according to claim 2, wherein said photodiode portion includes a photodiode coupled between said first and second nodes, said photodiode being conductive in said first state of said photodiode portion, and being substantially nonconductive in said second state of said photodiode portion.

7. A method of operating a latch circuit having first and second resonant tunneling devices coupled in series with each other between first and second nodes, and a reset portion coupled to said first and second nodes, including:
   configuring said reset portion to include a photodiode portion responsive to varying photonic energy for switching between first and second states that are different;
   configuring said latch circuit to include a first terminal to which is applied a first voltage, and a second terminal to which is applied a second voltage less than said first voltage;
   configuring said reset portion to include a first resistive element coupled between said first terminal and a first end of said photodiode portion, a first capacitive element coupled between said first node and said first end of said photodiode portion, a second resistive element coupled between said second terminal and a second end of said photodiode portion, and a second capacitive element coupled between said second node and said second end of said photodiode portion; configuring said latch circuit to include a first bias terminal to which is applied a first bias voltage; a second bias terminal to which is applied a second bias voltage different from said first bias voltage; a third resistive element coupled between said first bias terminal and said first node; and a fourth resistive element coupled between said second bias terminal and said second node; and causing said photodiode portion to normalize a voltage across each of said resonant tunneling devices when said reset portion is in said first state.

8. A method according to claim 7, including selecting first and second resonant tunneling diodes which are substantially identical to each other to serve as said first and second resonant tunneling devices.

9. A method according to claim 8, including configuring said photodiode portion to include a photodiode coupled between said first and second nodes, said photodiode being conductive in said first state of said photodiode portion, and being substantially nonconductive in said second state of said photodiode portion.

* * * * *